United States Patent
Billiet

(10) Patent No.: US 11,465,403 B2
(45) Date of Patent: Oct. 11, 2022

(54) LITHOGRAPHIC PRINTING PLATE PRECURSOR

(71) Applicant: Agfa NV, Mortsel (BE)

(72) Inventor: Thomas Billiet, Mortsel (BE)

(73) Assignee: AGFA NV, Mortsel (BE)

( * ) Notice: Subject to any disclaimer, the term of this patent is extended or adjusted under 35 U.S.C. 154(b) by 0 days.

(21) Appl. No.: 16/982,737

(22) PCT Filed: Mar. 19, 2019

(86) PCT No.: PCT/EP2019/056798
§ 371 (c)(1),
(2) Date: Sep. 21, 2020

(87) PCT Pub. No.: WO2019/179995
PCT Pub. Date: Sep. 26, 2019

(65) Prior Publication Data
US 2021/0001617 A1    Jan. 7, 2021

(30) Foreign Application Priority Data
Mar. 22, 2018   (EP) .................................... 18163285

(51) Int. Cl.
*B41C 1/10*   (2006.01)
*G03F 7/028*   (2006.01)
*G03F 7/004*   (2006.01)
*G03F 7/029*   (2006.01)

(52) U.S. Cl.
CPC .......... *B41C 1/1016* (2013.01); *B41C 1/1008* (2013.01); *G03F 7/0045* (2013.01); *G03F 7/028* (2013.01); *G03F 7/0295* (2013.01); *B41C 2201/02* (2013.01); *B41C 2210/02* (2013.01); *B41C 2210/04* (2013.01); *B41C 2210/08* (2013.01); *B41C 2210/12* (2013.01); *B41C 2210/20* (2013.01); *B41C 2210/22* (2013.01); *B41C 2210/24* (2013.01)

(58) Field of Classification Search
CPC ...................................................... B41C 1/10
See application file for complete search history.

(56) References Cited

U.S. PATENT DOCUMENTS

| 4,772,530 | A | 9/1988 | Gottschalk et al. |
| 4,772,541 | A | 9/1988 | Gottschalk et al. |
| 4,950,581 | A | 8/1990 | Koike et al. |
| 5,496,903 | A | 3/1996 | Watanabe et al. |
| 8,178,282 | B2 * | 5/2012 | Gallant ............... C09B 23/0066 430/302 |
| 2003/0190548 | A1 * | 10/2003 | Furukawa ................ C08K 5/55 430/270.1 |
| 2007/0059637 | A1 * | 3/2007 | Namba .................. B41M 5/368 430/270.1 |
| 2007/0099115 | A1 * | 5/2007 | Umemoto ............... G03F 7/033 430/270.1 |

FOREIGN PATENT DOCUMENTS

| EP | 1467250 A2 | 10/2004 |
| EP | 2098367 A1 | 9/2009 |
| WO | 2006/127313 A2 | 11/2006 |
| WO | 2006/136543 A3 | 12/2006 |

OTHER PUBLICATIONS

International Search Report dated Jun. 19, 2019 relating to PCT/EP2019/056798, 3 pages.
Written Opinion dated Jun. 19, 2019 relating to PCT/EP2019/056798, 5 pages.

* cited by examiner

Primary Examiner — Chanceity N Robinson
(74) Attorney, Agent, or Firm — Leydig, Voit & Mayer, Ltd.

(57) ABSTRACT

A lithographic printing plate precursor is disclosed including a coating comprising a polymerisable compound, an infrared absorbing dye, a photoinitiator including a trihaloalkyl group and a borate compound.

9 Claims, No Drawings

LITHOGRAPHIC PRINTING PLATE PRECURSOR

REFERENCE TO RELATED APPLICATIONS

This application is a 371 National Stage Application of PCT/EP2019/056798, filed Mar. 19, 2019, which claims the benefit of European Application No. 18163285.2, filed Mar. 22, 2018, the contents of which are incorporated by reference herein in their entirety.

TECHNICAL FIELD

The invention relates to a novel lithographic printing plate precursor.

BACKGROUND ART

Lithographic printing typically involves the use of a so-called printing master such as a printing plate which is mounted on a cylinder of a rotary printing press. The master carries a lithographic image on its surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-adhesive (ink-repelling) areas and during driographic printing, only ink is supplied to the master.

Lithographic printing masters are generally obtained by the image-wise exposure and processing of a radiation sensitive layer on a lithographic support. Imaging and processing renders the so-called lithographic printing plate precursor into a printing plate or master. Image-wise exposure of the radiation sensitive coating to heat or light, typically by means of a digitally modulated exposure device such as a laser, triggers a (physico-)chemical process, such as ablation, polymerization, insolubilization by crosslinking of a polymer or by particle coagulation of a thermoplastic polymer latex, solubilization by the destruction of intermolecular interactions or by increasing the penetrability of a development barrier layer. Although some plate precursors are capable of producing a lithographic image immediately after exposure, the most popular lithographic plate precursors require wet processing since the exposure produces a difference in solubility or difference in rate of dissolution in a developer between the exposed and the non-exposed areas of the coating. In positive working lithographic plate precursors, the exposed areas of the coating dissolve in the developer while the non-exposed areas remain resistant to the developer. In negative working lithographic plate precursors, the non-exposed areas of the coating dissolve in the developer while the exposed areas remain resistant to the developer. Most lithographic plate precursors contain a hydrophobic coating on a hydrophilic support, so that the areas which remain resistant to the developer define the ink-accepting, hence printing areas of the plate while the hydrophilic support is revealed by the dissolution of the coating in the developer at the non-printing areas.

Photopolymer printing plates rely on a working-mechanism whereby the coating—which typically includes free radically polymerisable compounds—hardens upon exposure. "Hardens" means that the coating becomes insoluble or non-dispersible in the developing solution and may be achieved through polymerization and/or crosslinking of the photosensitive coating upon exposure to light. Photopolymer plate precursors can be sensitized to blue, green or red light i.e. wavelengths ranging between 450 and 750 nm, to violet light i.e. wavelengths ranging between 350 and 450 nm or to infrared light i.e. wavelengths ranging between 750 and 1500 nm. Optionally, the exposure step is followed by a heating step to enhance or to speed-up the polymerization and/or crosslinking reaction.

In general, a toplayer or protective overcoat layer over the imageable layer is required to act as an oxygen barrier to provide the desired sensitivity to the plate. A toplayer typically includes water-soluble or water-swellable polymers such as for example polyvinylalcohol. Besides acting as barrier for oxygen, the toplayer should best be easily removable during processing and be sufficiently transparent for actinic radiation, e.g. from 300 to 450 nm or from 450 to 750 nm or from 750 to 1500 nm.

The classical workflow of photopolymer plates involves first an exposure step of the photopolymer printing plate precursor in a violet or infrared platesetter, followed by a wash step of the protective overcoat layer, an alkaline developing step, and a rinse and gum step. Over the past years, there is a clear evolution in the direction of a simplified workflow where the wash step is eliminated and where the processing and gumming step are carried out in one single step or where processing is carried out with a neutral gum and then gummed in a second step. Alternatively, on-press processing wherein the plate is mounted on the press and the coating layer is developed by interaction with the fountain and ink that are supplied to the plate during the press run, has become very popular. During the first runs of the press, the non-image areas are removed from the support and thereby define the non-printing areas of the plate.

Optionally, the exposure step is followed by a heating step to enhance or to speed-up the polymerization and/or crosslinking reaction, and/or to improve the adhesion of the image parts to the substrate. This heating step is believed to selectively crosslink those regions of the coating that were selectively imaged during the exposure step, rendering them preferentially less soluble in a developer. As a result, the robustness on the press of the plates—i.e. the press life—is significantly improved.

The presslife of photopolymer plates is further related to the cohesive strength within the polymerized photolayer. The higher the cohesive strength, the higher the presslife. The cohesive strength can preferably be improved by increasing the crosslinking degree and/or by supramolecular non-covalent interactions such as H-bonding, Van der Waals interaction and dipole-dipole interactions. The press life of photopolymer plates can also be improved by post-irradiation and/or heating the image formed on the support after the development and/or gumming step—also referred to as "baking" or "post-baking". Typically, this post-baking step is carried out by heating the plate in a large heating oven at a temperature of about 235° C. to 290° C. during a relatively long time of about 2 to 5 minutes, even up to 10 minutes. This process can substantially extend the life of the plate on the press.

EP 1 910 082 discloses a heat-sensitive lithographic printing plate precursor comprising a coating including an infrared absorbing dye which is capable of forming a colour upon IR exposure or heating whereby a visual contrast between image and non-image areas is obtained. This visual contrast may be further improved by including a borate salt to the coating.

U.S. Pat. Nos. 4,772,530 and 4,772,541 disclose a composition including triphenylbutylborate or trianisylbutylborate anions as photoinitiators which, upon actinic light exposure, generate a radical.

U.S. Pat. No. 4,950,581 discloses a photopolymerizable composition comprising a polymerizable monomer which is capable of being photopolymerized by active light, a photopolymerization borate initiator containing at least one alkyl group, and an organic non-ionic dye.

EP 1 467 250 discloses a photosensitive composition containing an infrared absorber, a borate initiator compound including at least one alkyl group, a polymerizable compound, a binder polymer, and a compound having a weight average molecular weight of not more than 3,000 and containing at least one carboxylic acid group.

WO2006/127313 discloses a negative-working printing plate precursor which includes a radically polymerisable element, an initiator system and a tetraarylborate salt.

Printing plate precursors of the prior art often suffer from an increased tendency to toning and/or formation of defects in the coating after storage. Storage conditions, such as light intensity, temperature and relative humidity, influence this tendency. Also, the sensitivity of the plate precursors may reduce after storage. The stock storability of unprocessed plate precursors—i.e. the period of time in which the properties of the plate precursor remains relatively constant—, is often referred to in the art as "shelf life". It is important for a high quality printing plate that the plate precursor exhibits a good shelf life, i.e. no/limited loss of sensitivity, no/limited formation of defects in the coating, and/or no/limited tendency of toning. Especially printing plate precursors which are processed with a gum solution and/or which are processed on-press with fountain solution and ink, as described above, may suffer from this shelf life problem. Indeed, as such image-wise exposed plate precursors are processed under non-aggressive conditions—i.e. without application of strongly alkaline (pH≥12) solutions, the removal of the coating in the non-exposed areas can be incomplete (i.e. insufficient clean-out) and this may result in an increased tendency of accepting ink in the hydrophilic non-image areas on the press (i.e. toning).

SUMMARY OF INVENTION

It is therefore an object of the present invention to provide a heat sensitive printing plate based on photopolymerisation which offers an excellent sensitivity and/or a good storage stability, also referred to herein as shelf-life.

A good shelf life refers to no/limited loss of sensitivity, and/or no/limited formation of defects in the coating, and/or no/limited tendency of toning within time. This has been evaluated by means of an ageing test which is described in the Examples.

This object is realised by the printing plate precursor defined in claim 1 with preferred embodiments defined in the dependent claims. The invention has the specific feature that the printing plate material includes a coating comprising a photopolymerisable composition including a polymerization initiator which is a trihaloalkyl sulfone initiator and a borate compound.

It has surprisingly been observed that upon heat and/or light exposure of the printing plate precursor of the present invention, its performance remains stable, even after long-term storage of the unexposed precursor. Long-term storage refers to for example at least six month storage but depends on the storage conditions such as for example temperature and humidity. It is believed that the specific combination of the borate compound and the trihaloalkyl sulfone initiator prevents degradation and/or inactivation of the initiator, whereby upon exposure, polymerization at these degraded/inactivated areas is reduced or even prevented and so-called pinholes are formed and/or become visible after processing—especially gum processing and/or on press processing.

It is a further object of the present invention to provide a method for making a lithographic printing plate comprising the steps of:
image-wise exposing the printing plate precursor including the coating as defined above to heat and/or IR radiation;
developing the exposed precursor.

The development is preferably carried out by treating the precursor with a gum solution and/or by mounting the precursor on a plate cylinder of a lithographic printing press and rotating the plate cylinder while feeding dampening liquid and/or ink to the precursor.

Other features, elements, steps, characteristics and advantages of the present invention will become more apparent from the following detailed description of preferred embodiments of the present invention. Specific embodiments of the invention are also defined in the dependent claims.

DESCRIPTION OF EMBODIMENTS

The lithographic printing plate precursor of the current invention comprises a coating including a photopolymerisable layer including both a borate compound and a trihaloalkyl sulfone initiator, further also referred to as "TBM-initiator".

Borate Compound

The borate compound present in the coating refers to a chemical compound including a borate anion and a cation as counterion. Preferably the borate anion is a tetrahedral boron anion. The borate compound is preferably represented by the following Formula I:

Formula I wherein $R_b^1$, $R_b^2$, $R_b^3$ and $R_b^4$ are independently an optionally substituted aliphatic hydrocarbon group, an optionally substituted aryl or heteroaryl group; and $M^+$ is an alkali metal cation such as e.g. $Li^+$, $Na^+$, $K^+$, an optional substituted ammonium ion, preferably according to Formula II.

Formula II wherein
$R_n^1$, $R_n^2$ and $R_n^3$ are independently an optionally substituted aliphatic hydrocarbon group, an optionally substituted aryl or heteroaryl group or a halogen atom.

In a preferred embodiment, $R_b^1$, $R_b^2$, $R_b^3$ and $R_b^4$ are independently an optionally substituted aryl or heteroaryl group and $M^+$ is an alkali metal cation such as e.g. $Li^+$, $Na^+$, $K^+$, or an optional substituted ammonium ion according to Formula II. More preferably, $R_b^1$, $R_b^2$, $R_b^3$ and $R_b^4$ are independently an optionally substituted aryl group. $M^+$ is preferably an alkali metal cation such as e.g. $Li^+$, $Na^+$, $K^+$, most preferably $Na^+$.

In a highly preferred embodiment the borate compound includes at least one optionally substituted phenyl group, more preferably at least two optionally substituted phenyl groups, even more preferably at least three optionally substituted phenyl groups and most preferably four optionally substituted phenyl groups. The counterion is most preferably an alkali metal cation such as e.g. $Li^+$, $Na^+$, $K^+$, most preferably $Na^+$.

The borate compound may be used singly or in admixture of two or more thereof. With respect to the content, the borate compound is preferably present in an amount comprised between 0.05 and 30% by weight, more preferably between 0.1 and 25% by weight, and most preferably from 0.5 and 15% by weight relative to the whole of solids of the photopolymerisable layer.

The optionally substituted aryl is preferably an optionally substituted phenyl, benzyl, tolyl or an ortho- meta- or para-xylyl, naphtyl, anthracenyl, phenanthrenyl, and/or combinations thereof. The optionally substituted heteroaryl group is preferably a monocyclic or polycyclic aromatic ring comprising carbon atoms and one or more heteroatoms in the ring structure, preferably, 1 to 4 heteroatoms, independently selected from nitrogen, oxygen, selenium and sulphur or combinations thereof. Preferred examples thereof include an optionally substituted furyl, pyridinyl, pyrimidyl, pyrazoyl, imidazoyl, oxazoyl, isoxazoyl, thienyl, tetrazoyl, thiazoyl, (1,2,3) triazoyl, (1,2,4)triazoyl, thiadiazoyl, thiofenyl group and/or combinations thereof.

The optional substituents represent an alkyl, cycloalkyl, alkenyl or cyclo alkenyl group, an alkynyl group, an aryl or heteroaryl group, an alkylaryl or arylalkyl group, an alkoxy or aryloxy group, a thio alkyl, thio aryl or thio heteroaryl group, a hydroxyl group, —SH, a carboxylic acid group or an alkyl ester thereof, a sulphonic acid group or an alkyl ester thereof, a phosphonic acid group or an alkyl ester thereof, a phosphoric acid group or an alkyl ester thereof, an amino group, a sulphonamide group, an amide group, a nitro group, a nitrile group, a halogen, or a combination thereof.

The Initiator

The TBM-initiator is a compound capable of generating free radicals upon exposure, optionally in the presence of a sensitizer. The TBM-initiator is an optionally substituted trihaloalkyl sulfone compound wherein halo independently represents bromo, chloro, iodo or fluoro and sulfone is a chemical compound containing a sulfonyl functional group attached to two carbon atoms.

The TBM-initiator is an optionally substituted trihaloalkyl aryl or heteroaryl sulfone compound. The optionally substituted aryl is preferably an optionally substituted phenyl, benzyl, tolyl or an ortho- meta- or para-xylyl, naphtyl, anthracenyl, phenanthrenyl, and/or combinations thereof. The optionally substituted heteroaryl group is preferably a monocyclic or polycyclic aromatic ring comprising carbon atoms and one or more heteroatoms in the ring structure, preferably, 1 to 4 heteroatoms, independently selected from nitrogen, oxygen, selenium and sulphur or combinations thereof. Preferred examples thereof include an optionally substituted furyl, pyridinyl, pyrimidyl, pyrazoyl, imidazoyl, oxazoyl, isoxazoyl, thienyl, tetrazoyl, thiazoyl, (1,2,3) triazoyl, (1,2,4)triazoyl, thiadiazoyl, thiofenyl group and/or combinations thereof. Preferably the TBM-initiator is an optionally substituted trihalomethyl aryl sulfone; more preferably a tribromomethyl aryl sulfone, most preferably the TBM-initiator is an optionally substituted tribromomethyl phenyl sulfone.

The phenyl group of the tribromomethyl phenyl sulfone is preferably substituted by at least one electron-donating group. The phenyl group may be substituted on the ortho, para or meta position, preferably on the ortho or para position, more preferably on the para position. The phenyl group may be substituted by at least one electron-donating group, by two or more electron-donating group or by at least one electron-donating group and one or more other group(s). The phenyl group is preferably substituted by one electron-donating group, more preferably by one electron-donating group in the para or ortho position, most preferably by one electron-donating group in the para position. The electron-donating group is preferably selected from a hydroxyl group, an alkoxy group, an alkyl group, an amino group, a mono-alkyl amino group, a mono-aryl amino group, a di-alkyl amino group, a di-aryl amino group, a tri-alkyl silane group, —NH(CO)R or —NH(CO)NHR wherein R is an alkyl or aryl group, or —O⁻M⁺ wherein $M^+$ is an alkali metal ion, an ammonium ion or a tetra-alkyl ammonium ion, more preferably a hydroxyl group, an alkoxy group or an alkyl group, most preferably a hydroxyl group.

The term "alkyl" herein means all variants possible for each number of carbon atoms in the alkyl group i.e. methyl, ethyl, for three carbon atoms: n-propyl and isopropyl; for four carbon atoms: n-butyl, isobutyl and tertiary-butyl; for five carbon atoms: n-pentyl, 1,1-dimethyl-propyl, 2,2-dimethylpropyl and 2-methyl-butyl, etc. Preferably, the alkyl group is preferably a $C_1$ to $C_6$-alkyl group. Most preferably the alkyl is a methyl group.

The term "substituted", in e.g. substituted alkyl group means that the alkyl group may be substituted by other atoms than the atoms normally present in such a group, i.e. carbon and hydrogen. For example, a substituted alkyl group may include a halogen atom or a thiol group. An unsubstituted alkyl group contains only carbon and hydrogen atoms.

The optional substituents represent an alkyl, cycloalkyl, alkenyl or cyclo alkenyl group, an alkynyl group, an aryl or heteroaryl group, an alkylaryl or arylalkyl group, an alkoxy or aryloxy group, a thio alkyl, thio aryl or thio heteroaryl group, a hydroxyl group, —SH, a carboxylic acid group or an alkyl ester thereof, a sulphonic acid group or an alkyl ester thereof, a phosphonic acid group or an alkyl ester thereof, a phosphoric acid group or an alkyl ester thereof, an amino group, a sulphonamide group, an amide group, a nitro group, a nitrile group, a halogen, or a combination thereof.

A suitable alkenyl group is preferably a $C_2$ to $C_6$-alkenyl group such as an ethenyl, n-propenyl, n-butenyl, n-pentenyl, n-hexenyl, iso-propenyl, iso-butenyl, iso-pentenyl, neo-pentenyl, 1-methylbutenyl, iso-hexenyl, cyclopentenyl, cyclohexenyl and methylcyclohexenyl group.

A suitable alkynyl group is preferably a $C_2$ to $C_6$-alkynyl group; a suitable aralkyl group is preferably a phenyl group or naphthyl group including one, two, three or more $C_1$ to $C_6$-alkyl groups; a suitable alkaryl group is preferably a $C_1$ to $C_6$-alkyl group including an aryl group, preferably a phenyl group or naphthyl group.

A cyclic group or cyclic structure includes at least one ring structure and may be a monocyclic- or polycyclic group, meaning one or more rings fused together.

The amount of the TBM-initiator typically ranges between 0.1 and 30% by weight, preferably between 0.5 and 20% by weight, most preferably between 1 and 10% by weight relative to the total weight of the non volatile components of the photopolymerisable composition.

Suitable examples of polymerization initiators used in the present invention are listed below:
4-hydroxyphenyl-tribromomethyl-sulfone;
2-hydroxyphenyl-tribromomethyl-sulfone;
4-methoxyphenyl-tribromomethyl-sulfone;
2-methoxyphenyl-tribromomethyl-sulfone;
2,4-dimethoxyphenyl-tribromomethyl-sulfone;
4-tolyl-tribromomethyl-sulfone;
tribromomethyl-[4-(2-hydroxyethoxy)phenyl]sulfone; and
4-(tribromomethanesulfonyl)-phenoxy-acetic acid.

In addition to the TBM-polymerisation initiator, other free radical initiators capable of generating free radicals directly or in the presence of a sensitizer upon exposure can be used in this invention.

Examples of polymerization initiators other than the TBM-initiator include onium salts, halomethyl group-containing compounds, peroxides, azo based polymerization initiators, azide compounds, and quinonediazides. Of these, onium salts, especially sulfonium salts are preferable in view of storage stability.

The Lithographic Printing Plate Precursor

The lithographic printing plate precursor according to the present invention is negative-working, i.e. after exposure and development the non-exposed areas of the coating are removed from the support and define hydrophilic (non-printing) areas, whereas the exposed coating is not removed from the support and defines oleophilic (printing) areas. The hydrophilic areas are defined by the support which has a hydrophilic surface or is provided with a hydrophilic layer. The hydrophobic areas are defined by the coating, hardened upon exposing, optionally followed by a heating step. Areas having hydrophilic properties means areas having a higher affinity for an aqueous solution than for an oleophilic ink; areas having hydrophobic properties means areas having a higher affinity for an oleophilic ink than for an aqueous solution.

"Hardened" means that the coating becomes insoluble or non-dispersible for the developing solution and may be achieved through polymerization and/or crosslinking of the photosensitive coating, optionally followed by a heating step to enhance or to speed-up the polymerization and/or cross-linking reaction. In this optional heating step, hereinafter also referred to as "pre-heat", the plate precursor is heated, preferably at a temperature of about 80° C. to 150° C. and preferably during a dwell time of about 5 seconds to 1 minute.

The coating has at least one layer including a photopolymerisable composition, said layer is also referred to as the "photopolymerisable layer". The coating may include an intermediate layer, located between the support and the photopolymerisable layer. The lithographic printing precursors can be multi-layer imageable elements.

The printing plate of the present invention is characterized that it can be exposed at a low energy density, i.e. below 190 mJ/m²; preferably between 70 mJ/m² and 150 mJ/m²; more preferably between 75 mJ/m² and 120 mJ/m² and most preferably of maximum 100 mJ/m².

Support

The lithographic printing plate used in the present invention comprises a support which has a hydrophilic surface or which is provided with a hydrophilic layer. The support is preferably a grained and anodized aluminium support, well known in the art. Suitable supports are for example disclosed in EP 1 843 203 (paragraphs [0066] to [0075]). The surface roughness, obtained after the graining step, is often expressed as arithmetical mean center-line roughness Ra (ISO 4287/1 or DIN 4762) and may vary between 0.05 and 1.5 μm. The aluminum substrate of the current invention has preferably an Ra value below 0.45 μm, more preferably below 0.40 μm and most preferably below 0.30 μm. The lower limit of the Ra value is preferably about 0.1 μm. More details concerning the preferred Ra values of the surface of the grained and anodized aluminum support are described in EP 1 356 926. By anodising the aluminum support, an $Al_2O_3$ layer is formed and the anodic weight (g/m² $Al_2O_3$ formed on the aluminum surface) varies between 1 and 8 g/m². The anodic weight is preferably ≥3 g/m², more preferably ≥3.5 g/m² and most preferably 4.0 g/m²

The grained and anodized aluminium support may be subjected to so-called post-anodic treatments, for example a treatment with polyvinylphosphonic acid or derivatives thereof, a treatment with polyacrylic acid, a treatment with potassium fluorozirconate or a phosphate, a treatment with an alkali metal silicate, or combinations thereof. Alternatively, the support may be treated with an adhesion promoting compound such as those described in EP 1 788 434 in [0010] and in WO 2013/182328. However, for a precursor optimized to be used without a pre-heat step it is preferred to use a grained and anodized aluminium support without any post-anodic treatment.

Besides an aluminium support, a plastic support, for example a polyester support, provided with one or more hydrophilic layers as disclosed in for example EP 1 025 992 may also be used.

Photopolymer Coating

The coating has at least one layer including a photopolymerisable composition, said layer is also referred to as the "photopolymerisable layer". The coating may include an intermediate layer, located between the support and the photopolymerisable layer.

The photopolymerisable layer includes besides the TBM-initiator and the borate compound as discussed above, an infrared absorbing compound, a polymerisable compound and optionally a binder. The photopolymerisable layer has a coating thickness preferably ranging between 0.2 and 5.0 g/m², more preferably between 0.4 and 3.0 g/m², most preferably between 0.6 and 2.2 g/m².

The Infrared Absorbing Compound

The IR absorbing compound present in the coating is preferably an infrared absorbing dye also referred to as IR dye. The infrared absorbing dyes preferably have an absorption maximum above 780 nm up to 1500 nm. Particular preferred dyes are cyanine, merocyanine, indoaniline, oxonol, pyrilium and squarilium dyes. Most preferred are heptamethinecyane dyes. Examples of suitable IR dyes may be found in EP 1 359 008 paragraph [0030] to [0032] including the references cited therein. Other suitable sensitizers are disclosed in U.S. Pat. Nos. 6,410,205, 5,049,479, EP 1 079 276, EP 1 369 232, EP 1 369 231, EP 1 341 040, US 2003/0124460, EP 1 241 002 and EP 1 288 720.

The concentration of the IR-dyes with respect to the total dry weight of the coating, may be from 0.1 to 20.0% by weight, more preferably from 0.5 to 15.0% by weight, most preferred from 1.0 to 10.0% by weight. According to the present invention, the amount of the infrared dye is preferably from 0.1 to 3% by weight, more preferably from 0.2 to 1.5% by weight and most preferably from 0.5 to 1% by weight.

The infrared absorbing compound is preferably represented by Formula III:

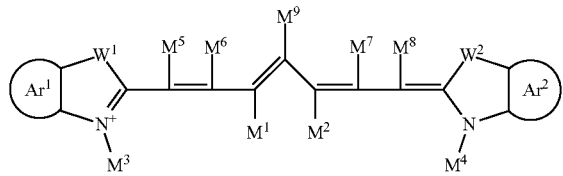

Formula III wherein $Ar^1$ and $Ar^2$ are independently an optionally substituted aryl group or an aryl group with an annulated benzene ring which is optionally substituted, $W^1$ and $W^2$ are independently a sulphur atom or a —$CM^{10}M^{11}$ group wherein $M^{10}$ and $M^{11}$ are independently an optionally substituted aliphatic hydrocarbon group or an optionally substituted (hetero)aryl group, or wherein $M^{10}$ and $M^{11}$ together comprise the necessary atoms to form a cyclic structure, $M^1$ and $M^2$ together comprise the necessary atoms to form an optionally substituted cyclic structure, preferably $M^1$ and $M^2$ together comprise the necessary atoms to form an optionally substituted 5-membered ring, $M^3$ and $M^4$ independently represent an optionally substituted aliphatic hydrocarbon group, $M^5$, $M^6$, $M^7$ and $M^8$ independently represent hydrogen, a halogen or an optionally substituted aliphatic hydrocarbon group, $M^9$ represents a halogen, an optionally substituted aliphatic hydrocarbon group, an optionally substituted (hetero)aryl group, —$NR^1R^2$, —$NR^1$—CO—$R^6$, —$NR^1$—$SO_2$—$R^4$ or —$NR^1$—SO—$R^5$; wherein $R^1$ and $R^2$ independently represent hydrogen, an optionally substituted aliphatic hydrocarbon group or an optionally substituted (hetero)aryl group;

$R^4$ and $R^6$ independently represent —$OR^7$, —$NR^8R^9$ or —$CF_3$; wherein $R^7$ represents an optionally substituted (hetero)aryl group or an optionally branched aliphatic hydrocarbon group and $R^8$ and $R^9$ independently represent hydrogen, an optionally substituted aliphatic hydrocarbon group or an optionally substituted (hetero)aryl group, or wherein $R^8$ and $R^9$ together comprise the necessary atoms to form a cyclic structure;

$R^5$ represents hydrogen, an optionally substituted aliphatic hydrocarbon group, $SO_3^-$, —$COOR^{10}$ or an optionally substituted (hetero)aryl group; wherein $R^{10}$ represents an optionally substituted (hetero)aryl group or an aliphatic hydrocarbon group; and the infrared absorbing compound may include one or more counter ions in order to obtain an electrically neutral molecule.

An aliphatic hydrocarbon group preferably represents an alkyl, cycloalkyl, alkenyl, cyclo alkenyl or alkynyl group; suitable groups thereof are described above. Suitable hetero (aryl) groups—i.e. suitable aryl or heteroaryl groups—are described above.

Suitable examples of optional substituents represent an alkyl, cycloalkyl, alkenyl or cyclo alkenyl group, an alkynyl group, an aryl or heteroaryl group, an alkylaryl or arylalkyl group, an alkoxy or aryloxy group, a thio alkyl, thio aryl or thio heteroaryl group, a hydroxyl group, —SH, a carboxylic acid group or an alkyl ester thereof, a sulphonic acid group or an alkyl ester thereof, a phosphonic acid group or an alkyl ester thereof, a phosphoric acid group or an alkyl ester thereof, an amino group, a sulphonamide group, an amide group, a nitro group, a nitrile group, a halogen, or a combination thereof.

The IR dye can be a neutral, a zwitterionic, an anionic or a cationic dye depending on the type of the substituting groups and the number of each of the substituting groups. The dye may have one anionic or acid group, selected from —CO2H, —CONHSO2Rh, —SO2NHCORi, —SO2NHSO2Rj, —PO3H2, —OPO3H2, —OSO3H, —S—SO3H or —SO3H groups or their corresponding salts, wherein Rh, Ri and Rj independently represent an aryl or an alkyl group, preferably a methyl group, and wherein the salts are preferably alkali metal salts or ammonium salts, including mono- or di- or tri- or tetra-alkyl ammonium salts.

The IR-dye is preferably presented by one of the following formulae IV to VIII:

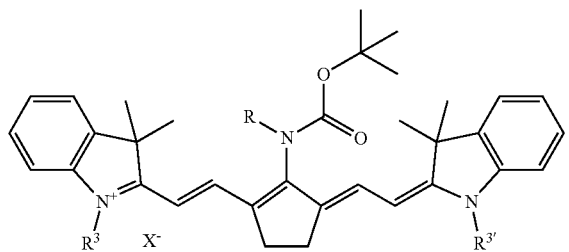

Formula IV

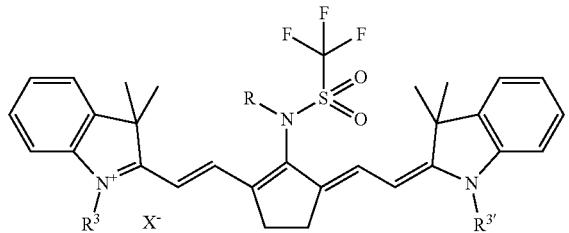

Formula V

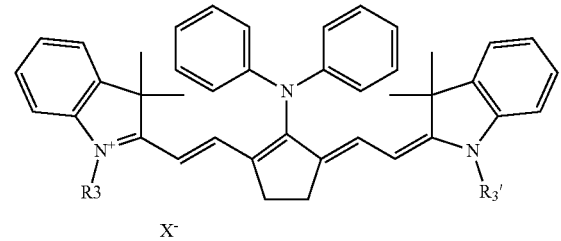

Formula VI wherein $X^-$ represents halogen, sulphonate, perfluorosulphonate, tosylate, tetrafluoroborate, hexafluorophosphate, arylborate or arylsulphonate; and $R^3$, $R^{3'}$ independently represent an optionally substituted alkyl group, preferably a methyl or ethyl; or an ether group, preferably —$CH_2$—$CH_2$—O—$CH_3$.

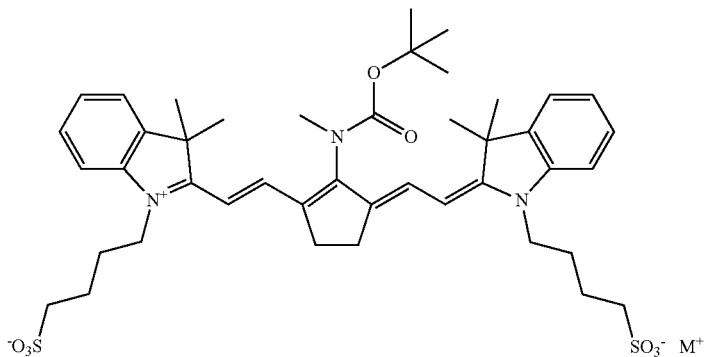

Formula VII

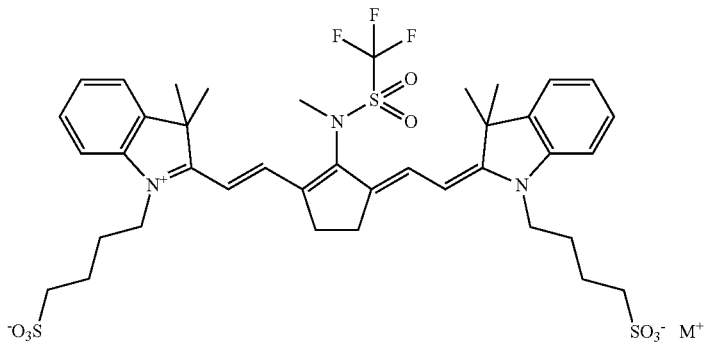

Formula VIII wherein $M^+$=$Li^+$, $Na^+$, $K^+$, $NH_4^+$, $R'R''R'''NH^+$ wherein R', R", R'" are independently a H atom, an optional substituted alkyl or aryl group;

The infrared absorbing dye preferably has no substantial absorption in the visible light wavelength range and is thus preferably colourless or pale-coloured. The infrared absorbing dye preferably has an absorption maximum above 780 nm up to 1500 nm. However, the infrared absorbing dyes according to formulae III to VIII are colourless or pale-coloured and change into a coloured compound when exposed to heat and/or light in the presence of a TBM-initiator, or, in other words, a coating comprising at least one of these IR absorbing dyes and a TBM-initiator forms a clear print-out image upon exposure to heat and/or light. It is believed that upon exposure, a redox reaction occurs whereby a colored, oxidized compound is obtained. This is of specific interest as the presence of a colorant such as for example a dye, a pigment or a dye precursor is redundant whereby the risk of staining of equipment and/or processing fluids is eliminated. In addition, elimination of a colorant is favorable from an economical point of view. Furthermore, as the colour change is obtained immediately after the exposure step and thus a print-out image is formed, the plate is specifically suited for development on-press i.e. development by mounting the precursor on a plate cylinder of a lithographic printing press and rotating the plate cylinder while feeding dampening liquid and/or ink to the coating. Moreover, the exposure energy required to obtain a print-out image is low compared to the systems provided in the art, for example below 150 mJ/m$^2$, even far below 120 mJ/m$^2$; a clear print-out image is already obtained at energy levels of about 80 to 100 mJ/m$^2$. In addition, the print-out image is already obtained at a low concentration of IR dye; for example at an amount of 0.1 to 3% by weight.

The colour difference between the exposed and non-exposed areas of the coating may be calculated from CIE L*a*b* colour coordinates of the exposed areas of the image areas (exposed areas) of the coating and the CIE L*a*b* colour coordinates of non-image areas (non-exposed areas) of the coating, and is denoted as ΔE. Upon exposure of the coating with a low energy density, for example between 70 and 150 mJ/m$^2$, more preferably between 75 and 120 mJ/m$^2$, most preferably of maximum 100 mJ/m$^2$, a print-out image may be formed characterised by a CIE 1976 colour difference ΔE of at least 3, more preferably at least 3.5 and most preferably at least 4. ΔE is the CIE 1976 colour distance Delta E that is defined by the pair wise Euclidean distance of the CIE L*a*b* colour coordinates. CIE L*a*b* colour coordinates are obtained from reflection measurement in 45/0 geometry (non-polarized), using CIE 2° observer and D50 as illuminant. More details are described in CIE S 014-4/E: 2007 Colourimetry—Part 4: CIE 1976 L*a*b* Colour Spaces and CIE publications and CIE S 014-1/E: 2006, CIE Standard Colourimetric Observers.

The CIE 1976 colour coordinates L*, a* and b* are part of the well-known CIE (Commission Internationale de l'Eclairage) system of tristimulus colour coordinates, which also includes the additional chroma value C* defined as $C*=[(a)^2+(b)^2]^{1/2}$. The CIE 1976 colour system is described in e.g. "Colorimetry, CIE 116-1995: Industrial Colour Difference Evaluation", or in "Measuring Colour" by R. W. G. Hunt, second edition, edited in 1992 by Ellis Horwood Limited, England.

CIE L*a*b* values are preferably measured following the ASTM E308-85 method.

Polymerisable Compound

According to a preferred embodiment of the present invention, the polymerisable compound is a polymerisable monomer or oligomer including at least one terminal ethylenic group, hereinafter also referred to as "free-radical polymerisable monomer". The polymerisation involves the linking together of the free-radical polymerisable monomers.

Suitable free-radical polymerisable monomers are disclosed in [0042] and [0050] of EP 2 916 171 and are incorporated herein by reference.

Besides the TBM-initiator, the coating may optionally further contain any free radical initiator capable of generating free radicals upon exposure directly or in the presence of a sensitizer. Suitable free-radical initiators are described in WO 2005/111727 from page 15 line 17 to page 16 line 11 and EP 1 091 247 and may include for example hexaarylbisimidazole compound (HABI; dimer of triaryl-imidazole), aromatic ketones, aromatic onium salts, organic peroxides, thio compounds, ketooxime ester compounds, borate compounds, azinium compounds, metallocene compounds, active ester compounds and further compounds having a carbon-halogen bond.

The photopolymerisable layer may also comprise a co-initiator. Typically, a co-initiator is used in combination with a free radical initiator. Suitable co-initiators for use in the photopolymer coating are disclosed in U.S. Pat. Nos. 6,410,205; 5,049,479; EP 1 079 276, EP 1 369 232, EP 1 369 231, EP 1 341 040, US 2003/0124460, EP 1 241 002, EP 1 288 720 and in the reference book including the cited references: Chemistry & Technology UV & EB formulation for coatings, inks & paints—Volume 3—Photoinitiators for Free Radical and Cationic Polymerisation by K. K. Dietliker— Edited by P. K. T. Oldring—1991—ISBN 0 947798161. Specific co-initiators, as described in EP 107 792, may be present in the photopolymerizable layer to further increase the sensitivity. Preferred co-initiators are disclosed in EP 2 916 171 [0051] and are incorporated herein by reference.

A very high sensitivity can be obtained by including a sensitizer such as for example an optical brightener in the coating. Suitable examples of optical brighteners as sensitizers are described in WO 2005/109103 page 24, line 20 to page 39. Other preferred sensitizers are blue, green or red light absorbing sensitizers, having an absorption spectrum between 450 nm and 750 nm. Useful sensitizers can be selected from the sensitizing dyes disclosed in U.S. Pat. Nos. 6,410,205; 5,049,479; EP 1 079 276, EP 1 369 232, EP 1 369 231, EP 1 341 040, US 2003/0124460, EP 1 241 002 and EP 1 288 720.

The photopolymerizable layer preferably includes a binder. The binder can be selected from a wide series of organic polymers. Compositions of different binders can also be used. Useful binders are described in WO2005/111727 page 17 line 21 to page 19 line 30, EP 1 043 627 in paragraph [0013] and in WO2005/029187 page 16 line 26 to page 18 line 11. Also of interest are particulate binders such as for example homopolymers and copolymers including monomeric units derived from styrene, methylstyrene, acrylonitrile, vinyl acetate, vinyl butyral, vinyl alcohol, acrylamide, methylol acrylamide, methylol methacrylamide, acrylic acid, methacrylic acid, methyl methacyrlate, methyl acrylate, butyl acrylate, butyl methacrylate, polyethylene glycol methacrylate, polyethylene glycol acrylate, polypropylene glycol acrylate, polypropylene glycol methacrylate, hydroxyethyl acrylate, hydroxyethyl methacrylate, hydroxypropyl acrylate, hydroxypropyl methacrylate, and maleic anhydride/vinylmethylether copolymers, optionally containing a reactive functional group such as for example ethylenically unsaturated groups i.e. an acryloyl group, a methacryloyl group, a vinyl group, an allyl group, an isocyanate group, an epoxy group, an amino group, a hydroxyl group, a carboxyl group or an acid anhydride.

The photopolymerisable layer may also comprise particles which increase the resistance of the coating against manual or mechanical damage. The particles may be inorganic particles, organic particles or fillers such as described in for example U.S. Pat. No. 7,108,956. In addition, spacer particles may be added to the coating. More details of suitable spacer particles described in EP 2 916 171 [0053] to [0056] are incorporated herein by reference. The spacer particles may be substituted with one or more reactive groups.

The photopolymerizable layer may also comprise an inhibitor. Particular inhibitors for use in the photopolymer coating are disclosed in U.S. Pat. No. 6,410,205, EP 1 288 720 and EP 1 749 240.

The photopolymerizable layer may further comprise an adhesion promoting compound. The adhesion promoting compound is a compound capable of interacting with the support, preferably a compound having an addition-polymerizable ethylenically unsaturated bond and a functional group capable of interacting with the support. Under "interacting" is understood each type of physical and/or chemical reaction or process whereby, between the functional group and the support, a bond is formed which can be a covalent bond, an ionic bond, a complex bond, a coordinate bond or a hydrogen-bond, and which can be formed by an adsorption process, a chemical reaction, an acid-base reaction, a complex-forming reaction or a reaction of a chelating group or a ligand. The adhesion promoting compounds described in EP 2 916 171 [0058] are incorporated herein by reference.

Various surfactants may be added into the photopolymerisable layer to allow or enhance the developability of the precursor; especially developing with a gum solution. Both polymeric and small molecule surfactants for example nonionic surfactants are preferred. More details are described in EP 2 916 171 [0059] and are incorporated herein by reference.

The coating may include on the photopolymerisable layer, a toplayer or protective overcoat layer which acts as an oxygen barrier layer including water-soluble or water-swellable binders. Printing plate precursors which do not contain a toplayer or protective overcoat layer are also referred to as overcoat-free printing plate precursors. In the art, it is well-known that low molecular weight substances present in the air may deteriorate or even inhibit image formation and therefore usually a toplayer is applied to the coating. A toplayer should be easily removable during development, adhere sufficiently to the photopolymerisable layer or optional other layers of the coating and should preferably not inhibit the transmission of light during exposure. Preferred binders which can be used in the toplayer are polyvinyl alcohol and the polymers disclosed in WO 2005/029190; U.S. Pat. No. 6,410,205 and EP 1 288 720, including the cited references in these patents and patent applications. The most preferred binder for the toplayer is polyvinylalcohol. The polyvinylalcohol has preferably a hydrolysis degree ranging between 74 mol % and 99 mol %, more preferably between 88-98%. The weight average molecular weight of the polyvinylalcohol can be measured by the viscosity of an aqueous solution, 4% by weight, at 20° C. as defined in DIN 53 015, and this viscosity number ranges preferably between 2 and 26, more preferably between 2 and 15, most preferably between 2 and 10.

The overcoat layer may optionally include other ingredients such as inorganic or organic acids, matting agents or wetting agents as disclosed in EP 2 916 171 and are incorporated herein by reference.

The coating thickness of the optional toplayer is preferably between 0.10 and 1.75 g/m$^2$, more preferably between 0.15 and 1.3 g/m$^2$, most preferably between 0.20 and 1.0 g/m$^2$. In a more preferred embodiment of the present invention, the optional toplayer has a coating thickness between 0.25 and 1.75 g/m$^2$ and comprises a polyvinylalcohol having a hydrolysis degree ranging between 74 mol % and 99 mol % and a viscosity number as defined above ranging between 3 and 26.

According to the present invention there is also provided a method for making a negative-working lithographic printing plate comprising the steps of imagewise exposing a printing plate precursor followed by developing the imagewise exposed precursor so that the non-exposed areas are dissolved in the developer solution. Optionally, after the imaging step, a heating step is carried out to enhance or to speed-up the polymerization and/or crosslinking reaction. The lithographic printing plate precursor can be prepared by (i) applying on a support the coating as described above and (ii) drying the precursor.

Exposure Step

The printing plate precursor is preferably image-wise exposed by a laser emitting IR-light. Preferably, the imagewise exposing step is carried out off-press in a platesetter, i.e. an exposure apparatus suitable for image-wise exposing the precursor with a laser such as a laser diode, emitting around 830 nm or a Nd YAG laser emitting around 1060 nm, or by a conventional exposure in contact with a mask. In a preferred embodiment of the present invention, the precursor is image-wise exposed by a laser emitting IR-light.

Preheat Step

After the exposing step, the precursor may be pre-heated in a preheating unit, preferably at a temperature of about 80° C. to 150° C. and preferably during a dwell time of about 5 seconds to 1 minute. This preheating unit may comprise a heating element, preferably an IR-lamp, an UV-lamp, heated air or a heated roll. Such a preheat step can be used for printing plate precursors comprising a photopolymerisable composition to enhance or to speed-up the polymerization and/or crosslinking reaction.

Development Step

Subsequently to the exposing step or the preheat step, when a preheat step is present, the plate precursor may be processed (developed). Before developing the imaged precursor, a pre-rinse step might be carried out especially for the negative-working lithographic printing precursors having a protective oxygen barrier or topcoat. This pre-rinse step can be carried out in a stand-alone apparatus or by manually rinsing the imaged precursor with water or the pre-rinse step can be carried out in a washing unit that is integrated in a processor used for developing the imaged precursor. The washing liquid is preferably water, more preferably tap water. More details concerning the wash step are described in EP 1 788 434 in [0026].

During the development step, the non-exposed areas of the image-recording layer are at least partially removed without essentially removing the exposed areas. The processing liquid, also referred to as developer, can be applied to the plate e.g. by rubbing with an impregnated pad, by dipping, immersing, coating, spincoating, spraying, pouring-on, either by hand or in an automatic processing apparatus. The treatment with a processing liquid may be combined with mechanical rubbing, e.g. by a rotating brush. During the development step, any water-soluble protective layer present is preferably also removed. The development is preferably carried out at temperatures between 20 and 40° C. in automated processing units.

In a highly preferred embodiment, the processing step as described above is replaced by an on-press processing whereby the imaged precursor is mounted on a press and processed on-press by rotating said plate cylinder while feeding dampening liquid and/or ink to the coating of the precursor to remove the unexposed areas from the support. In a preferred embodiment, only dampening liquid is supplied to the plate during start-up of the press. After a number of revolutions of the plate cylinder, preferably less than 50 and most preferably less than 5 revolutions, also the ink supply is switched on. In an alternative embodiment, supply of dampening liquid and ink can be started simultaneously or only ink can be supplied during a number of revolutions before switching on the supply of dampening liquid.

The processing step may also be performed by combining embodiments described above, e.g. combining development with a processing liquid with development on-press by applying ink and/or fountain.

Processing Liquid

The processing liquid may be an alkaline developer or solvent-based developer. Suitable alkaline developers have been described in US2005/0162505. An alkaline developer is an aqueous solution which has a pH of at least 11, more typically at least 12, preferably from 12 to 14. Alkaline developers typically contain alkaline agents to obtain high pH values can be inorganic or organic alkaline agents. The developers can comprise anionic, non-ionic and amphoteric surfactants (up to 3% on the total composition weight); biocides (antimicrobial and/or antifungal agents), antifoaming agents or chelating agents (such as alkali gluconates), and thickening agents (water soluble or water dispersible polyhydroxy compounds such as glycerine or polyethylene glycol).

Preferably, the processing liquid is a gum solution whereby during the development step the non-exposed areas of the photopolymerisable layer are removed from the support and the plate is gummed in a single step. The development with a gum solution has the additional benefit that, due to the remaining gum on the plate in the non-exposed areas, an additional gumming step is not required to protect the surface of the support in the non-printing areas. As a result, the precursor is processed and gummed in one single step which involves a less complex developing apparatus than a developing apparatus comprising a developer tank, a rinsing section and a gumming section. The gumming section may comprise at least one gumming unit or may comprise two or more gumming units. These gumming units may have the configuration of a cascade system, i.e. the gum solution, used in the second gumming unit and present in the second tank, overflows from the second tank to the first tank when gum replenishing solution is added in the second gumming unit or when the gum solution in the second gumming unit is used once-only, i.e. only starting gum solution is used to develop the precursor in this second gumming unit by preferably a spraying or jetting technique. More details concerning such gum development is described in EP1 788 444.

A gum solution is typically an aqueous liquid which comprises one or more surface protective compounds that are capable of protecting the lithographic image of a printing plate against contamination, e.g. by oxidation, fingerprints, fats, oils or dust, or damaging, e.g. by scratches during handling of the plate. Suitable examples of such surface protective compounds are film-forming hydrophilic polymers or surfactants. The layer that remains on the plate after treatment with the gum solution preferably comprises between 0.005 and 20 g/m² of the surface protective compound, more preferably between 0.010 and 10 g/m², most preferably between 0.020 and 5 g/m². More details concerning the surface protective compounds in the gum solution can be found in WO 2007/057348 page 9 line 3 to page 11 line 6. As the developed plate precursor is developed and gummed in one step, there is no need to post-treat the processed plate.

The gum solution preferably has a pH value between 3 and 11, more preferably between 4 and 10, even more preferably between 5 and 9, and most preferably between 6 and 8. A suitable gum solution is described in for example EP 1 342 568 in [0008] to [0022] and WO2005/111727. The gum solution may further comprise an inorganic salt, an anionic surfactant, a wetting agent, a chelate compound, an antiseptic compound, an anti-foaming compound and/or an ink receptivity agent and/or combinations thereof. More details about these additional ingredients are described in WO 2007/057348 page 11 line 22 to page 14 line 19.

Drying and Baking Step

After the processing step the plate may be dried in a drying unit. In a preferred embodiment the plate is dried by heating the plate in the drying unit which may contain at least one heating element selected from an IR-lamp, an UV-lamp, a heated metal roller or heated air.

After drying the plate can optionally be heated in a baking unit and/or irradiated with LED light, preferably UV LED light. More details concerning the heating in a baking unit can be found in WO 2007/057348 page 44 line 26 to page 45 line 20.

The printing plate thus obtained can be used for conventional, so-called wet offset printing, in which ink and an aqueous dampening liquid is supplied to the plate. Another suitable printing method uses a so-called single-fluid ink without a dampening liquid. Suitable single-fluid inks have been described in U.S. Pat. Nos. 4,045,232; 4,981,517 and 6,140,392. In a most preferred embodiment, the single-fluid ink comprises an ink phase, also called the hydrophobic or oleophilic phase, and a polyol phase as described in WO 00/32705.

EXAMPLES

Example 1

1. Preparation of the Printing Plates PP-01 to PP-14
Preparation of the Aluminium Support S-01

A 0.3 mm thick aluminium foil was degreased by spraying with an aqueous solution containing 26 g/l NaOH at 65° C. for 2 seconds and rinsed with demineralised water for 1.5 seconds. The foil was then electrochemically grained during 10 seconds using an alternating current in an aqueous solution containing 15 g/l HCl, 15 g/l $SO_4^{2-}$–ions and 5 g/l $Al^{3+}$ ions at a temperature of 37° C. and a current density of about 100 A/dm2. Afterwards, the aluminium foil was then desmutted by etching with an aqueous solution containing 5.5 g/l of NaOH at 36° C. for 2 seconds and rinsed with demineralised water for 2 seconds. The foil was subsequently subjected to anodic oxidation during 15 seconds in an aqueous solution containing 145 g/l of sulfuric acid at a temperature of 50° C. and a current density of 17 A/dm2, then washed with demineralised water for 11 seconds and dried at 120° C. for 5 seconds.

The support thus obtained was characterized by a surface roughness Ra of 0.35-0.4 μm (measured with interferometer NT1100) and had an oxide weight of 3.0 g/m².

Preparation of the Printing Plate Precursors PP-01 to PP-014

Photopolymerisable Layer

The printing plate precursor PPP-01 to PPP-14 were produced by coating onto the above described support S-01 the components as defined in Tables 1 and 2 dissolved in a mixture of 35% by volume of MEK and 65% by volume of Dowanol PM (1-methoxy-2-propanol, commercially available from DOW CHEMICAL Company). The coating solution was applied at a wet coating thickness of 30 μm and then dried at 120° C. for 1 minute in a circulation oven. Inventive printing plate precursors PPP-01 to PPP-09 and comparative printing plate precursors PPP-10 to PPP-14 were obtained.

TABLE 1

| Printing plate precursors PPP-01 to PPP-09 | | | | | | | | | |
|---|---|---|---|---|---|---|---|---|---|
| Ingredients g/m² | PPP-01 inv | PPP-02 inv | PPP-03 inv | PPP-04 inv | PPP-05 inv | PPP-06 inv | PPP-07 inv | PPP-08 inv | PPP-09 inv |
| S2025 (1) | 0.022 | = | = | = | = | = | = | = | = |
| S-LEC BX35-Z (2) | 0.150 | = | = | = | = | = | = | = | = |
| FST 510 (3) | 0.281 | = | = | = | = | = | = | = | = |
| CN-UVE 151M (4) | 0.281 | = | = | = | = | = | = | = | = |
| Tegoglide 410 (5) | 0.0015 | = | = | = | = | = | = | = | = |
| p-OH-TBMPS (6) | 0.060 | 0.060 | 0.060 | 0.045 | 0.045 | 0.030 | 0.030 | 0.060 | 0.060 |
| Sipomer PAM 100 (7) | 0.130 | = | = | = | = | = | = | = | = |
| Albritect CP 30 (8) | 0.024 | = | = | = | = | = | = | = | = |
| Pigm. Disp. (9) | 0.120 | = | = | = | = | = | = | = | = |
| Additive-01 (10) | 0.005 | 0.010 | 0.0025 | 0.005 | 0.010 | 0.0025 | 0.005 | — | — |
| Additive-02 (10) | — | — | — | — | — | — | — | 0.0025 | 0.005 |
| Additive-03 (10) | — | — | — | — | — | — | — | — | — |
| Additive-04 (10) | — | — | — | — | — | — | — | — | — |

TABLE 2

Printing plate precursors PPP-10 to PPP-14

| Ingredients g/m² | PPP-10 comp | PPP-11 comp | PPP-12 comp | PPP-13 comp | PPP-14 comp |
|---|---|---|---|---|---|
| S2025 (1) | 0.022 | = | = | = | = |
| S-LEC BX35-Z (2) | 0.150 | = | = | = | = |
| FST 510 (3) | 0.281 | = | = | = | = |
| CN-UVE 151M (4) | 0.281 | = | = | = | = |
| Tegoglide 410 (5) | 0.0015 | = | = | = | = |
| p-OH-TBMPS (6) | 0.060 | = | = | = | = |
| Sipomer PAM 100 (7) | 0.130 | = | = | = | = |
| Albritect CP 30 (8) | 0.024 | = | = | = | = |
| Pigm. Disp. (9) | 0.120 | = | = | = | = |
| Additive-01 (10) | — | — | — | — | — |
| Additive-02 (10) | — | — | — | — | — |
| Additive-03 (10) | 0.0025 | 0.005 | — | — | — |
| Additive-04 (10) | — | — | 0.0025 | 0.005 | — |

1) IR-01 is an infrared absorbing dye commercially available from FEW Chemicals as S2025 having the following structure:

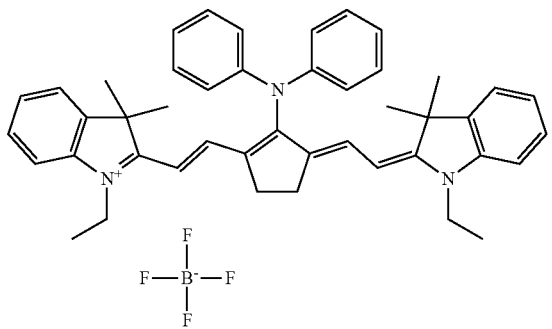 [SMILES: CCN1/C(=C/C=C2\CCC(/C=C/C3=[N+](CC)c4ccccc4C3(C)C)=C2N(c2ccccc2)c2ccccc2)C(C)(C)c2ccccc21 ; F[B-](F)(F)F]

2) S-LEC BX35-Z, a polyvinylbutyral commercially available from Sekisui;
3) FST 510 is a reaction product from 1 mole of 2,2,4-trimethylhexamethylenediisocyanate and 2 moles of hydroxyethyl-methacrylate commercially available from AZ Electronics as a 82 wt. % solution in MEK;
4) CN-UVE 151M is an epoxy diacrylate monomer commercially available from Sartomer;
5) Tegoglide 410 is a surfactant commercially available from Evonik Tego Chemie GmbH;
6) p-OH-TBMPS is 4-hydroxyphenyl-tribromomethyl-sulfone
7) Sipomer PAM 100 is a methacrylate phosphonic ester commercially available from Rhodia;
8) Albritect CP 30, is a copolymer of vinylphosphonic acid and acrylic acid commercially available as a 20 wt. % aqueous dispersion from Rhodia;
9) Pigm. Disp. contains in a 50/50 ratio Hostaperm Blue P-BFSTM commercially available from Clariant and Disperbyk 182 commercially available from BYK Chemie GmbH.;
10) Additive-01 is sodium tetraphenylborate, commercially available from Aldrich; Additive-02 is represented by the formula:

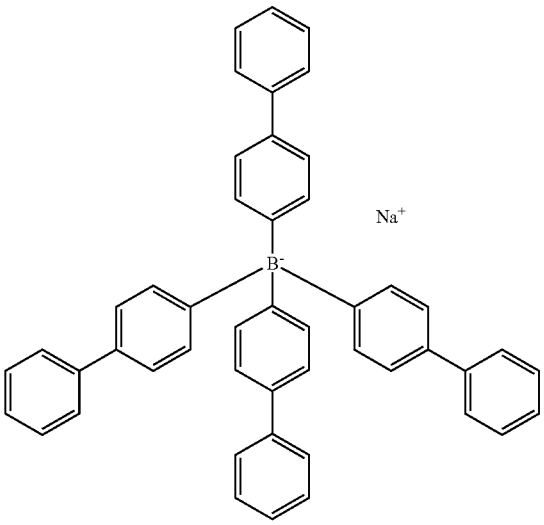

Additive-03 is potassium tetrafluoroborate; commercially available form Aldrich;
Additive-04 is sodium hexafluorophosphate, commercially available form Aldrich.

Protective Top Layer

On top of the photosensitive layer, a solution in water with the composition as defined in Table 3 was coated (40 µm) on the printing plate precursors, and dried at 110° C. for 2 minutes. The so-formed protective top layer OC has a dry thickness or dry coating weight of 1.25 g/m².

TABLE 3 composition of the protective layer

| Ingredients g | OC |
|---|---|
| Mowiol 4-88 (1) | 19.1 |
| Mowiol 8-88 (1) | 5.84 |
| Luviskol K30 (2) | 5.95 |
| Acticide LA1206 (3) | 0.06 |
| Lutensol A8 (4) | 0.30 |
| Water | 969 |

1) Mowiol 4-88TM and Mowiol 8-88TM are partially hydrolyzed polyvinylalcohols commercially available from Kuraray;
2) Luviskol K30TM is polyvinylpyrrolidone homopolymer commercially available from BASF;
3) Acticide LA1206TM is a biocide commercially available from Thor;
4) Lutensol A8TM is a surface active agent commercially available from BASF.

Imaging

The printing plate precursors PPP-01 to PPP-14 were imaged at 2400 dpi with a High Power Creo 40W TE38 thermal Platesetter™ (200 lpi Agfa Balanced Screening (ABS)), commercially available from Kodak and equipped with a 830 nm IR laser diode, at energy densities between 50 and 150 mJ/cm2.

Development

After image-wise exposure, the printing plate precursors PPP-01 to PPP-14 were developed with "Violet CF gum NP" gumming solution commercially available from Agfa, at a speed of 1.2 m/min and a gum temperature of 24° C. Plates are dried with hot air at 50° C. in the dryer unit of the VCF 85 Clean Out Unit™ commercially available from Agfa. Printing plates PP-01 to PP-14 were obtained.

2. Sensitivity

The dot rendering on the printing plates PP-01 to PP-14 was evaluated with a 50× magnification hand microscope and measured with a Techkon SpectroPlate™. The sensitivity was defined as the exposure energy needed to obtain a minimal dot gain (the difference between the measured dot coverage and the digital value) of 3% for a 40% 200 lpi ABS dot rendering. The sensitivity results are summarized in Table 4 below.

3. Accelerated Ageing

An accelerated ageing test was performed by subjecting another set of printing plate precursors PPP-01 to PPP-14 to a controlled environment of 34% relative humidity and 65° C. for a time period of 2 days. The treated samples were subsequently subjected to a full solid exposure at the energy level as determined by the sensitivity, and developed as described above. The exposed and developed plates were evaluated with a 50× magnification hand microscope and a score was given by visual interpretation.

The observed defects after the ageing test which may occur are typically circular shaped unpolymerized spots that are especially visually after development of the printing plates. The accelerated ageing test is a measure for the shelf life of the plates.

The results of the accelerated ageing test are summarized in Tables 4 to 6 below.

TABLE 4

Sensitivity and accelerated ageing test results of inventive printing plates PP-01 to PP-07 including borate compound Additive-01

| Printing Plate | Additive-01* | p-OH-TBMPS | Sensitivity (mJ/cm$^2$) | Defects after ageing** |
|---|---|---|---|---|
| PP-01 inventive | 0.005 | 0.060 | 74 | 3 |
| PP-02 Inventive | 0.010 | 0.060 | 58 | 3 |
| PP-03 Inventive | 0.0025 | 0.060 | 92 | 2 |
| PP-04 inventive | 0.005 | 0.045 | 83 | 3 |
| PP-05 inventive | 0.010 | 0.045 | 62 | 3 |
| PP-06 inventive | 0.0025 | 0.030 | 98 | 2 |
| PP-07 Inventive | 0.005 | 0.030 | 90 | 3 |

*See Table 1;
***the score with a 50 × magnification was given by visual evaluation han microscope as follows:
1: large amount of unpolymerized defects after accelerated ageing test;
2: some unpolymerized defects after accelerated ageing test;
3: substantially no unpolymerized defects after accelerated ageing test.

TABLE 5

Sensitivity and accelerated ageing test results of printing plates PP-08 and PP-09 including borate compound Additive-02

| Printing Plate | Additive-02* | p-OH-TBMPS g/m$^2$ | Sensitivity mJ/cm$^2$ | Defects after ageing* |
|---|---|---|---|---|
| PP-08 inventive | 0.0025 | 0.060 | 111 | 2 |
| PP-09 inventive | 0.005 | 0.060 | 113 | 2 |

*See Tables 1 and 4

TABLE 6

Sensitivity and accelerated ageing test results of comparative printing plates PP-10 to PP-14

| Printing Plate | Additive-03* | Additive-04 | Sensitivity (mJ/cm$^2$) | Defects after ageing* |
|---|---|---|---|---|
| PP-10 comparative | 0.0025 | — | 109 | 1 |
| PP-11 comparative | 0.005 | — | 119 | 1 |
| PP-12 comparative | — | 0.0025 | 112 | 1 |
| PP-13 comparative | — | 0.005 | 121 | 1 |
| PP-14 comparative | — | — | 105 | 1 |

*See Tables 1 and 4

Sensitivity

The results clearly demonstrate that the printing plates including the borate compound according to the present invention (Additive 1; Table 3) have a higher sensitivity compared to the comparative printing plates (Table 6):
the sensitivity of PP-01 to PP-07 is higher (exposure energy below 100 mJ/cm$^2$) compared to the sensitivity of PP-10 to PP-14 (exposure energy above 100 mJ/cm$^2$).

This effect is less pronounced for Additive 2 where the printing plates have a similar sensitivity (Tables 5 and 6).

The results further show that the sensitivity of the printing plates including a higher amount of the borate compound according to the present invention is further improved (Additive 1, Table 4); all plates including the same level of p-OH-TBMPS initiator.

This effect is less pronounced for Additive 2 (Table 5):
the sensitivity of PP-02 is higher than the sensitivity of PP-01 and
PP-03; the sensitivity of PP-01 is higher than the sensitivity of PP-03;
the sensitivity of PP-05 is higher than the sensitivity of PP-04;
the sensitivity of PP-07 is higher than the sensitivity of PP-06;
the sensitivity of PP-09 is similar to the sensitivity of PP-08.

Furthermore, by adding the borate compound according to the present invention to the coating of the printing plate, the level of radical initiator (p-OH-TBMPS) can be reduced while the sensitivity remains high (Additive 1, Table 4):
the sensitivity of respectively printing plates PP-01, PP-04 and PP-07; printing plates PP-02 and PP-05; and printing plates PP-03 and PP-06, are similar.

Shelf Life

The printing plates including the borate compound according to the present invention have a higher shelf life compared to the comparative printing plates:
the defects visual after the ageing test of printing plates PP-01 to PP-09 (Tables 4 and 5) is substantially lower compared to the defects after the ageing test of printing plates PP-10 to PP-14 (Table 6).

4. Printing

Printing plates PP-01 to PP-14 (aged and non-aged) were mounted on a Heidelberg GTO 52 printing press. Each print job was started using K+E Skinnex 800 SPEED IK black ink (trademark of BASF Druckfarben GmbH) and 4 wt % Prima FS303 SF (trademark of Agfa Graphics) and 8% isopropanol in water as fountain solution. A compressible blanket was used and printing was performed on non-coated offset paper.

All non-aged printing plates PP-01 to PP-14 and aged, inventive printing plates PP-01 to PP-09 showed good print properties while in the image parts of the aged comparative printing plates PP-10 to PP-14 many defects are visible.

Example 2

1. Preparation of the Printing Plates PP-15 to PP-20
Preparation of the Aluminium Support S-01
See Example 1.
Preparation of the Printing Plate Precursors PP-15 to PP-20
Photopolymerisable Layer
Printing plate precursors PPP-15 to PP-21 were produced by coating onto the above described support S-01 the components as defined in Table 7 dissolved in a mixture of 35% by volume of EK and 65% by volume of Dowanol PM (1-methoxy-2-propanol, commercially available from DO CHEMICAL Company). The coating solution was applied at a wet coating thickness of 30 μm and then dried at 120° C. for 1 minute in a circulation oven.

TABLE 7

Printing plate precursors PPP-15 to PPP-20

| Ingredients* g/m² | PPP-15 inv | PPP-16 inv | PPP-17 inv | PPP-18 inv | PPP-19 inv | PPP-20 comp |
|---|---|---|---|---|---|---|
| S2025 (1) | 0.022 | = | = | = | = | = |
| S-LEC BX35-Z (2) | 0.150 | = | = | = | = | = |
| FST 510 (3) | 0.281 | = | = | = | = | = |
| CN-UVE 151M (4) | 0.281 | = | = | = | = | = |
| Tegoglide 410 (5) | 0.0015 | = | = | = | = | = |
| p-OH-TBMPS (6) | 0.060 | 0.045 | 0.045 | 0.030 | 0.030 | 0.060 |
| Sipomer PAM 100 (7) | 0.130 | = | = | = | = | = |
| Albritect CP 30 (8) | 0.024 | = | = | = | = | = |
| Pigm. Disp. (9) | 0.120 | = | = | = | = | = |
| Additive-01 (10) | 0.0025 | 0.005 | 0.010 | 0.0025 | 0.005 | — |

*Ingredients as described in Table 1

Protective Top Layer

On top of the photosensitive layer, a solution in water with the composition as defined in Table 3 above was coated (40 μm) on the printing plate precursors, and dried at 110° C. for 2 minutes. The so-formed protective top layer OC has a dry thickness or dry coating weight of 1.25 g/m².

Imaging

The printing plate precursors PPP-15 to PPP-20 were imaged at 2400 dpi with a High Power Creo 40W TE38 thermal Platesetter™ (200 lpi Agfa Balanced Screening (ABS)), commercially available from Kodak and equipped with a 830 nm IR laser diode, at energy densities corresponding to their sensitivity determined as described in Example 1.

Development and Printing

Printing plates PP-15 to PP-20 were evaluated for development on press. The printing plates were mounted on a Heidelberg GT052 dalhgren press using K+E Skinnex 800 SPEED IK black ink (trademark of BASF Druckfarben GmbH) and 4 wt % Prima FS303 SF (trademark of Agfa Graphics) and 8% isopropanol in water as fountain solution. A compressible blanket was used and printing was performed on non-coated offset paper. Prior to paper feeding, 10 press revolution with only the dampening system followed by 5 revolutions with only the inking rollers was performed. Up to 500 sheets were printed and visual assessment of sheets 25, 50, 100, and 250 was performed to evaluate toning (i.e. accepting ink) in the non-image areas.

3. Toning Behaviour

Toning behaviour of the on press developed printing plates was visually assessed on printed sheets 25, 50, 100, and 250. The results are given in Table 8.

4. Accelerated Ageing

An accelerated ageing test was performed by subjecting another set of printing plate precursors PPP-15 to PPP-20 to a controlled environment of 34% relative humidity and 65° C. for a time period of 2 days. The treated samples were subsequently subjected to a full solid exposure at the energy level as determined by the sensitivity, and developed on press (see 2). The exposed and developed plates were evaluated with a 50× magnification hand microscope and a score was given by visual interpretation.

The observed defects after the ageing test which may occur are typically circular shaped unpolymerized spots that are especially visually after development of the printing plates. The accelerated ageing test is a measure for the shelf life of the plates.

The results of the accelerated ageing test are summarized in Table 8.

TABLE 8

Accelerated ageing results and toning behaviour of printing plates PP-15 to PP-20

| Printing Plate | Defects after ageing* | Toning behaviour** |
|---|---|---|
| PP-15 inventive | 2 | 3 |
| PP-16 inventive | 3 | 3 |
| PP-17 inventive | 3 | 4 |
| PP-18 inventive | 3 | 2 |
| PP-19 Inventive | 3 | 3 |
| PP-20 comparative | 1 | 3 |

*accelerated ageing: the score was given by visual evaluation with a 50 × magnification hand microscope on print as follows:
1: large amount of unpolymerized defects after accelerated ageing test;
2: some unpolymerized defects after accelerated ageing test;
3: substantially no unpolymerized defects after accelerated ageing test.
*toning behaviour: a visual score was given as follows:
1: toning;
2: no toning up to sheet 25;
3: no toning up to sheet 50;
4: no toning up to sheet 100.

The inventive printing plates PP-15 to PP-19 including the borate compound according to the present invention have a higher shelf life compared to the comparative printing plate PP-20:

the defects visual after the ageing test of printing plates PP-15 to PP-19 is substantially lower compared to the defects after the ageing test of printing plate PP-20.

Furthermore, the inventive printing plates PP-15 to PP-19 and the comparative printing plate PP-20 do not suffer from unacceptable toning after processing on press.

The invention claimed is:
1. A lithographic printing plate precursor comprising a support and a coating comprising:
a polymerizable compound;
an infrared absorbing compound;
a borate compound according to Formula I:

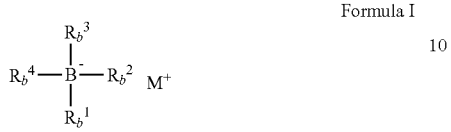

Formula I wherein $R_b^1$, $R_b^2$, $R_b^3$ and $R_b^4$ are independently an optionally substituted aliphatic hydrocarbon group, an optionally substituted aryl group, or an optionally substituted heteroaryl group; and $M^+$ is an alkali metal cation selected from $Li^+$, $Na^+$ or $K^+$ or is an optionally substituted ammonium ion; and
a photoinitiator, wherein the photoinitiator is a tribromomethyl aryl sulfone, wherein the aryl group of the tribromomethyl aryl sulfone is substituted by at least one electron-donating group in an ortho or para position.

2. The lithographic printing plate precursor of claim 1, wherein $M^+$ is an optionally substituted ammonium ion according to Formula II:

Formula II wherein
$R_n^1$, $R_n^2$ and $R_n^3$ are independently an optionally substituted aliphatic hydrocarbon group, an optionally substituted aryl group, an optionally substituted heteroaryl group, or a halogen.

3. The lithographic printing plate precursor of claim 1, wherein $R_b^1$, $R_b^2$, $R_b^3$ and $R_b^4$ are independently an optionally substituted aryl group or an optionally substituted heteroaryl group.

4. The lithographic printing plate precursor of claim 1, wherein the borate compound is present in the coating in an amount between 0.05% and 30% by weight.

5. The lithographic printing plate precursor of claim 1, wherein the infrared absorbing compound has a chemical structure according to Formula III:

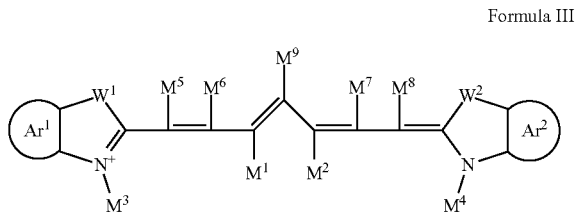

Formula III wherein
$Ar^1$ and $Ar^2$ are independently optionally substituted aryl groups,
$W^1$ and $W^2$ are independently a sulphur atom or a $—CM^{10}M^{11}$ group, wherein $M^{10}$ and $M^{11}$ are independently an optionally substituted aliphatic hydrocarbon group, an optionally substituted heteroaryl group or an optionally substituted aryl group, or wherein $M^{10}$ and $M^{11}$ together comprise the necessary atoms to form a cyclic structure,
$M^1$ and $M^2$ together comprise the necessary atoms to form an optionally substituted cyclic structure,
$M^3$ and $M^4$ independently are optionally substituted aliphatic hydrocarbon groups,
$M^5$, $M^6$, $M^7$ and $M^8$ independently are hydrogen, halogen, or an optionally substituted aliphatic hydrocarbon group,
$M^9$ is a halogen, an optionally substituted aliphatic hydrocarbon group, an optionally substituted aryl group, an optionally substituted heteroaryl group, $—NR^1R^2$, $—NR^1—CO—R^6$, $—NR^1—SO_2—R^4$ or $—NR^1—SO—R^5$; wherein
$R^1$ and $R^2$ independently are hydrogen, an optionally substituted aliphatic hydrocarbon group, an optionally substituted aryl group, or an optionally substituted heteroaryl group;
$R^4$ and $R^6$ independently are $—OR^7$, $—NR^8R^9$ or $—CF_3$; wherein $R^7$ is an optionally substituted aryl group, an optionally substituted heteroaryl group, or an optionally substituted aliphatic hydrocarbon group and $R^8$ and $R^9$ independently are hydrogen, an optionally substituted aliphatic hydrocarbon group, an optionally substituted aryl group or an optionally substituted heteroaryl group, or $R^8$ and $R^9$ together comprise the atoms of a cyclic structure;
$R^5$ is hydrogen, an optionally substituted aliphatic hydrocarbon group, $SO_3—$, $—COOR^{10}$, an optionally substituted aryl group, or an optionally substituted heteroaryl group; wherein $R^{10}$ is an optionally substituted aryl group, an optionally substituted heteroaryl group, or an aliphatic hydrocarbon group; and
the infrared absorbing compound optionally comprises one or more counter ions such that the infrared absorbing compound is electrically neutral.

6. A method for making a printing plate including the steps of
a. image-wise exposing the lithographic printing plate precursor of claim 1 to heat and/or IR radiation to produce a lithographic image consisting of image areas and non-image areas; and
b. developing the exposed precursor.

7. The method of claim 6, wherein the image-wise exposing step induces a colour change in the image areas.

8. The method of claim 6, wherein the precursor is developed by mounting the precursor on a plate cylinder of a lithographic printing press and rotating the plate cylinder while feeding dampening liquid and/or ink to the precursor.

9. The method of claim 6, wherein the precursor is developed by applying a gum solution to the precursor.

* * * * *